(12) United States Patent
Sattler et al.

(10) Patent No.: US 12,177,965 B2
(45) Date of Patent: Dec. 24, 2024

(54) COMPONENT CARRIER AND METHOD OF MANUFACTURING A COMPONENT CARRIER

(71) Applicant: AT&S Austria Technologie & Systemtechnik Aktiengesellschaft, Leoben (AT)

(72) Inventors: Sebastian Sattler, Graz (AT); Christian Vockenberger, Leoben (AT); Ahmad Bader Alothman Alterkawi, Graz (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 233 days.

(21) Appl. No.: 17/816,819

(22) Filed: Aug. 2, 2022

(65) Prior Publication Data
US 2023/0044122 A1 Feb. 9, 2023

(30) Foreign Application Priority Data
Aug. 3, 2021 (EP) .................................... 21189297

(51) Int. Cl.
*H05K 1/02* (2006.01)
*H01L 21/48* (2006.01)
(Continued)

(52) U.S. Cl.
CPC .......... *H05K 1/024* (2013.01); *H01L 21/4846* (2013.01); *H01L 23/13* (2013.01); *H01L 23/49838* (2013.01); *H01P 3/081* (2013.01); *H05K 1/0245* (2013.01); *H05K 3/0026* (2013.01); *H05K 3/0041* (2013.01); *H05K 2201/09036* (2013.01);
(Continued)

(58) Field of Classification Search
None
See application file for complete search history.

(56) References Cited

U.S. PATENT DOCUMENTS 10,257,921 B1 4/2019 Roy et al.
2004/0268287 A1 12/2004 Toh
(Continued)

FOREIGN PATENT DOCUMENTS

| CN | 108882515 A | 11/2018 |
|---|---|---|
| CN | 110324962 A | 10/2019 |

(Continued)

OTHER PUBLICATIONS

JP-04368005-A (Translation) (Year: 2024).*
(Continued)

*Primary Examiner* — Hoa C Nguyen
*Assistant Examiner* — John B Freal
(74) *Attorney, Agent, or Firm* — Robert A. Blaha; Smith Tempel Blaha LLC

(57) ABSTRACT

A component carrier includes a stack with at least one electrically conductive layer structure and/or at least one electrically insulating layer structure. The at least one electrically conductive layer structure includes a first trace. A tapering trench is formed in the at least one electrically insulating layer structure beside and below the first trace. A method of manufacturing the component carrier is also described.

18 Claims, 6 Drawing Sheets

(51) Int. Cl.
    *H01L 23/13*     (2006.01)
    *H01L 23/498*     (2006.01)
    *H01P 3/08*     (2006.01)
    *H05K 3/00*     (2006.01)

(52) U.S. Cl.
    CPC .............. *H05K 2201/09236* (2013.01); *H05K 2201/09827* (2013.01); *H05K 2201/10098* (2013.01)

(56) References Cited

U.S. PATENT DOCUMENTS

| | | | |
|---|---|---|---|
| 2008/0048796 A1* | 2/2008 | Shaul | ...................... H01P 3/003 333/4 |
| 2011/0260943 A1 | 10/2011 | Felic et al. | |
| 2017/0086288 A1 | 3/2017 | Ouyang et al. | |

FOREIGN PATENT DOCUMENTS

| | | | |
|---|---|---|---|
| JP | 04368005 A | * | 12/1992 |
| JP | H04368005 A | | 12/1992 |

OTHER PUBLICATIONS

Strohm, K.M. et al: "Silicon Micromachined CPW Transmission Lines", Sep. 23, 2022 (Sep. 23, 2002), Microwave Conference, 2002. 32nd European, IEEE, Piscataway, NJ, USA, pp. 1-4, XP031606248.

Culhaoglu, A.; Extended European Search Report in Application No. EP 21 18 9297.1; pp. 1-19; Jan. 18, 2022, European Patent Office, 80298 Munich Germany.

\* cited by examiner ical Field

Embodiments of the present disclosure relate to a component carrier and a method of manufacturing a component carrier.

BACKGROUND ART

In the context of growing product functionalities of component carriers equipped with one or more electronic components and increasing miniaturization of such electronic components as well as a rising number of electronic components to be mounted on the component carriers such as printed circuit boards, increasingly more powerful array-like components or packages having several electronic components are being employed, which have a plurality of contacts or connections, with ever smaller spacing between these contacts. Removal of heat generated by such electronic components and the component carrier itself during operation becomes an increasing issue. Also, an efficient protection against electromagnetic interference (EMI) becomes an increasing issue. At the same time, component carriers shall be mechanically robust and electrically and magnetically reliable so as to be operable even under harsh conditions.

SUMMARY

There may be a need for techniques to reduce losses and to generally improve the RF signal transmission characteristics of a component carrier including first and second traces.

To meet this need, a component carrier and a method of manufacturing a component carrier are provided as set forth in the independent claims.

According to an exemplary embodiment of the disclosure, a component carrier is provided. The component carrier comprises a stack comprising at least one electrically conductive layer structure and/or at least one electrically insulating layer structure. The at least one electrically conductive layer structure comprises a first trace. A tapering trench is formed in the at least one electrically insulating layer structure beside and below the first trace.

According to another exemplary embodiment of the disclosure, a method of manufacturing a component carrier is provided. The method comprises providing a stack comprising at least one electrically conductive layer structure and/or at least one electrically insulating layer structure, forming the at least one electrically conductive layer structure with a first trace, and forming a tapering trench in the at least one electrically insulating layer structure beside and below the first trace.

OVERVIEW OF EMBODIMENTS

In the context of the present application, the term "tapering trench" may particularly denote a trench that is tapered in the sense that the distance between opposing side walls of the trench changes (i.e., increases or decreases) from top to bottom of the trench.

According to an exemplary embodiment of the disclosure, the material influence (of the at least one electrically insulating layer structure) on the capability of the first trace to act as a high-speed/high-frequency RF transmission line can be significantly reduced. More specifically, by forming a tapering trench in the at least one electrically insulating layer structure beside and below the first trace, i.e., be removing dielectric material on at least one side of the first trace, the effective permittivity (also referred to as effective dielectric constant or Dk) is significantly reduced. The lower permittivity results in a lower group delay or faster signal speed, less insertion loss due to lower dielectric loss (also referred to as dissipation factor Df), and less electromagnetic coupling between two adjacent traces.

In the following, further exemplary embodiments of the component carrier and the method will be explained.

In an embodiment, the at least one electrically conductive layer structure further comprises a second trace. The first trace and the second trace are arranged side-by-side and the tapering trench is formed in the at least one electrically insulating layer structure between and below the first trace and the second trace.

In the context of the present application, the term "arranged side-by-side" may particularly denote that the first trace and the second trace are arranged with a certain distance between them, such that they extend substantially in parallel.

In an embodiment, the trench tapers away from at least one of the first trace and the second trace.

In other words, the trench gets narrower with increasing distance from the first and second traces, i.e., the trench is narrower at deeper positions (far away from the traces) than at higher positions (closer to the traces).

In an embodiment, the trench forms an undercut under at least one of the first trace and the second trace.

By forming an undercut under at least one of the first trace and the second trace, it is assured that a region (corresponding to the undercut) directly underneath the trace(s) is free of dielectric material. This is beneficial, as the concentration of the electromagnetic field is high in this region. Hence, losses are significantly reduced.

In an embodiment, the undercut is in a range from 2 μm to 40 μm, in particular from 5 μm to 10 μm.

In an embodiment, the trench is trapezoidal.

In other words, the cross-sectional shape of the tapering trench is a trapezoid. The non-parallel sides of the trapezoid may correspond to the side walls of the trench.

In an embodiment, the trench is air-filled, the trench is filled with a foam, or the trench is filled with a low Dk dielectric solid.

Accordingly, the permittivity of the trench is significantly lower than that of the surrounding material of the at least one electrically insulating layer.

In an embodiment, the first trace and the second trace are single-ended lines. Alternatively, the first trace and the second trace are differential lines.

In the first case, each of the first trace and the second trace forms an individual transmission line. In the other case, the first trace and the second trace are both part of the same differential transmission line.

In an embodiment, the component carrier further comprises a high-frequency component surface mounted on and/or embedded in the stack, a coupling antenna and at least one transmission line in the stack, wherein the first trace and/or the second trace connect the high-frequency component with the coupling antenna.

In an embodiment, a bottom of the trench is delimited by one of the at least one electrically conductive layer structure.

In other words, one of the at least one electrically conductive layer structure defines the bottom of the trench.

In an embodiment, a depth of the trench is in a range from 10 µm to 1000 µm, in particular from 50 µm to 800 µm, in particular from 100 µm to 500 µm, in particular from 120 µm to 320 µm, in particular around 127 µm.

In an embodiment, the first trace and the second trace are arranged at a main surface of the stack.

In an embodiment, the electrically insulating layer structure in which the trench is formed is free of reinforcing structures, such as fibers.

In an embodiment, the method comprises forming the trench by laser processing, in particular by laser cutting, or the method comprises forming the trench by etching, in particular by ion etching or plasma etching.

In an embodiment, the method comprises forming the trench by re-moving material of the at least one electrically insulating layer structure using one of the at least one electrically conductive layer structure as stop layer.

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming holes through the laminate, for instance by laser drilling or mechanical drilling, and by partially or fully filling them with electrically conductive material (in particular copper), thereby forming vias or any other through-hole connection. The filled hole either connects the whole stack, (through-hole connections extending through several layers or the entire stack), or the filled hole connects at least two electrically conductive layers, called via. Similarly, optical interconnections can be formed through individual layers of the stack in order to receive an electro-optical circuit board (EOCB). Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier. A substrate may be a, in relation to a PCB, comparably small component carrier onto which one or more components may be mounted and that may act as a connection medium between one or more chip(s) and a further PCB. For instance, a substrate may have substantially the same size as a component (in particular an electronic component) to be mounted thereon (for instance in case of a Chip Scale Package (CSP)). More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical, thermal and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) and/or a photoimageable or dry-etchable organic material like epoxy-based build-up material (such as epoxy-based build-up film) or polymer compounds (which may or may not include photo- and/or thermosensitive molecules) like polyimide or polybenzoxazole.

In an embodiment, the at least one electrically insulating layer structure comprises at least one of the group consisting of a resin or a polymer, such as epoxy resin, cyanate ester resin, benzocyclobutene resin, bismaleimide-triazine resin, polyphenylene derivate (e.g. based on polyphenylether PPE), polyimide (PI), polyamide (PA), liquid crystal polymer (LCP), polytetrafluoroethylene (PTFE) and/or a combination thereof. Reinforcing structures such as webs, fibers, spheres or other kinds of filler particles, for example made of glass (multilayer glass) in order to form a composite, could be used as well. A semi-cured resin in combination with a reinforcing agent, e.g., fibers impregnated with the above-mentioned resins is called prepreg. These prepregs are often named after their properties, e.g., FR4 or FR5, which describe their flame retardant properties. Although prepreg particularly FR4 are usually preferred for rigid PCBs, other materials, in particular epoxy-based build-up materials (such as build-up films) or photoimageable dielectric materials, may be used as well. For high frequency applications, high-frequency materials such as polytetrafluoroethylene, liquid crystal polymer and/or cyanate ester resins, may be preferred. Besides these polymers, low temperature cofired ceramics (LTCC) or other low, very low or ultra-low DK materials may be applied in the component carrier as electrically insulating structures.

In an embodiment, the at least one electrically conductive layer structure comprises at least one of the group consisting of copper, aluminum, nickel, silver, gold, palladium, tungsten and magnesium. Although copper is usually preferred, other materials or coated versions thereof are possible as well, in particular coated with supra-conductive material or conductive polymers, such as graphene or poly(3,4-ethylenedioxythiophene) (PEDOT), respectively.

The at least one component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. An inlay could be for instance a metal block, with or without an insulating material coating (IMS-inlay), which could be either embedded or surface mounted for the purpose of facilitating heat dissipation. Suitable materials are defined according to their thermal conductivity, which should be at least 2 W/mK. Such materials are often based, but not limited to metals, metal-oxides and/or ceramics as for instance copper, aluminum oxide ($Al_2O_3$) or aluminum nitride (AlN). In order to increase the heat exchange capacity, other geometries with increased surface area are frequently used as well. Furthermore, a component can be an active electronic component (having at least one p-n-junction implemented), a passive electronic component such as a resistor, an inductance, or capacitor, an electronic chip, a storage device (for instance a DRAM or another data memory), a filter, an integrated circuit (such as field-programmable gate array (FPGA), programmable array logic (PAL), generic array logic (GAL) and complex programmable logic devices (CPLDs)), a signal processing component, a power management component (such as a field-effect transistor (FET), metal-oxide-semiconductor field-effect transistor (MOSFET), complementary metal-oxide-semiconductor (CMOS), junction field-effect transistor (JFET), or insulated-gate field-effect transistor (IGFET), all based on semiconductor materials such as silicon carbide (SiC), gallium arsenide (GaAs), gallium nitride (GaN), gallium oxide ($Ga_2O_3$), indium gallium arsenide (InGaAs) and/or any other suitable inorganic compound), an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be an IC substrate, an interposer or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electro-magnetic radiation propagating from an environment, may be used as component.

In an embodiment, the component carrier is a laminate-type component carrier. In such an embodiment, the component carrier is a compound of multiple layer structures which are stacked and connected together by applying a pressing force and/or heat.

After processing interior layer structures of the component carrier, it is possible to cover (in particular by lamination) one or both opposing main surfaces of the processed layer structures symmetrically or asymmetrically with one or more further electrically insulating layer structures and/or electrically conductive layer structures. In other words, a build-up may be continued until a desired number of layers is obtained.

After having completed formation of a stack of electrically insulating layer structures and electrically conductive layer structures, it is possible to proceed with a surface treatment of the obtained layers structures or component carrier.

In particular, an electrically insulating solder resist may be applied to one or both opposing main surfaces of the layer stack or component carrier in terms of surface treatment. For instance, it is possible to form such a solder resist on an entire main surface and to subsequently pattern the layer of solder resist so as to expose one or more electrically conductive surface portions which shall be used for electrically coupling the component carrier to an electronic periphery. The surface portions of the component carrier remaining covered with solder resist may be efficiently protected against oxidation or corrosion, in particular surface portions containing copper.

It is also possible to apply a surface finish selectively to exposed electrically conductive surface portions of the component carrier in terms of surface treatment. Such a surface finish may be an electrically conductive cover material on exposed electrically conductive layer structures (such as pads, conductive tracks, etc., in particular comprising or consisting of copper) on a surface of a component carrier. If such exposed electrically conductive layer structures are left unprotected, then the exposed electrically conductive component carrier material (in particular copper) might oxidize, making the component carrier less reliable. A surface finish may then be formed for instance as an interface between a surface mounted component and the component carrier. The surface finish has the function to protect the exposed electrically conductive layer structures (in particular copper circuitry) and enable a joining process with one or more components, for instance by soldering. Examples for appropriate materials for a surface finish are Organic Solderability Preservative (OSP), Electroless Nickel Immersion Gold (ENIG), Electroless Nickel Immersion Palladium Immersion Gold (ENIPIG), gold (in particular hard gold), chemical tin, nickel-gold, nickel-palladium, etc.

The aspects defined above and further aspects of the disclosure are apparent from the examples of embodiment to be described hereinafter and are explained with reference to these examples of embodiment.

DETAILED DESCRIPTION OF ILLUSTRATED EMBODIMENTS

Figure 1:
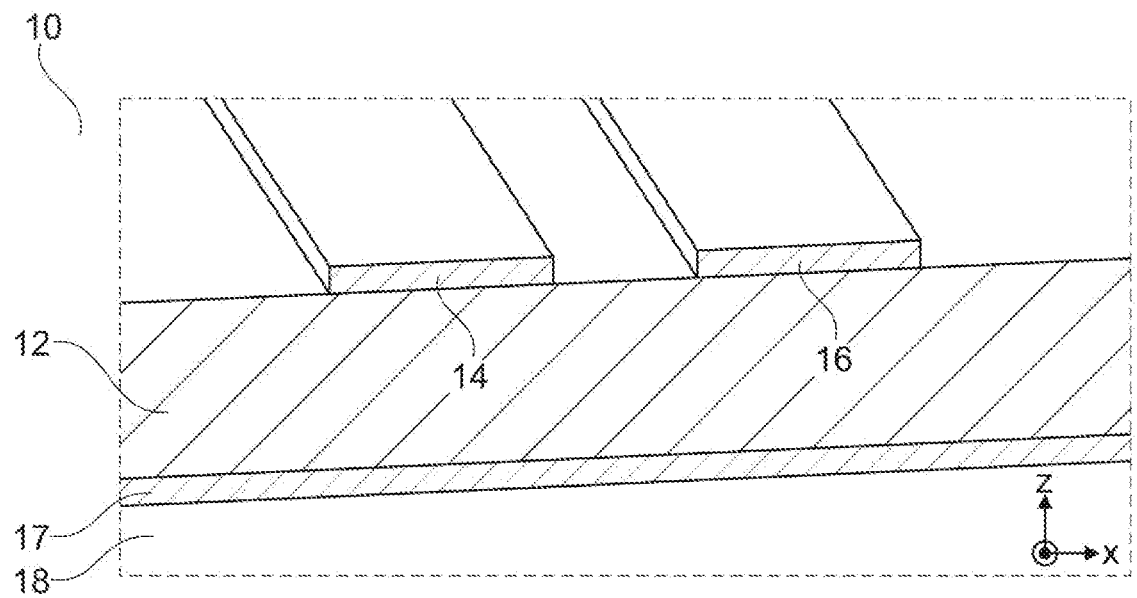
FIG. 1 shows a conventional component carrier including two traces.

The illustrations in the drawings are schematically presented. In different drawings, similar or identical elements are provided with the same reference signs.

FIG. 1 shows a conventional component carrier including two traces. More specifically, the component carrier comprises a stack 10 comprising at least one electrically conductive layer structure and at least one electrically insulating layer structure 12, wherein the at least one electrically conductive layer structure comprises a first trace 14 and a second trace 16 arranged side-by-side on top of the electrically insulating layer structure 12. Below the electrically insulating layer structure 12, the stack further comprises a further electrically conductive layer structure 17 arranged on top of a substrate 18.

As known in the art, the two neighboring traces 14 and 16, which are arranged quite close to each other, have a coupling effect between them. In case of a differential signal transmission, this strong coupling is wanted, as it reduces EMI as well as crosstalk to other signal traces.

Figure 2:
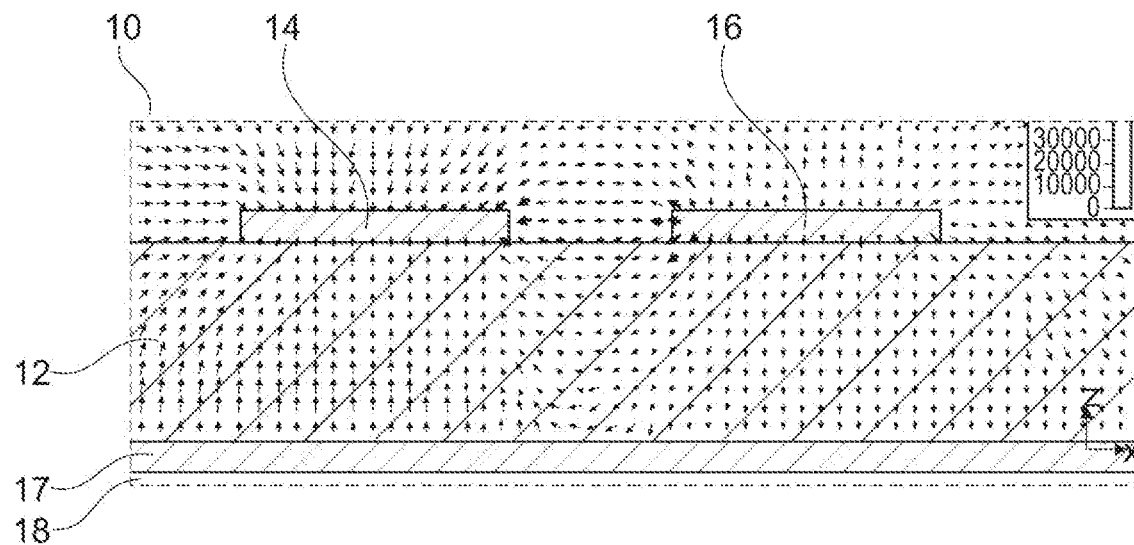
FIG. 2 shows an electric field distribution for the component carrier shown in FIG. 1.

FIG. 2 shows an electric field distribution for the component carrier shown in FIG. 1. More specifically, FIG. 2 shows the distribution of electric field lines between the first and second traces 14, 16 and the further electrically conductive layer structure 17 (which acts as a ground layer). As can be seen, the strength of the electric field decreases rapidly in the electrically insulating structure 12 below the traces—the deeper the position within the electrically insulating structure 12 (i.e., the further away from the traces 14, 16 in the downward direction in FIG. 2), the weaker is the electric field.

Figure 3:
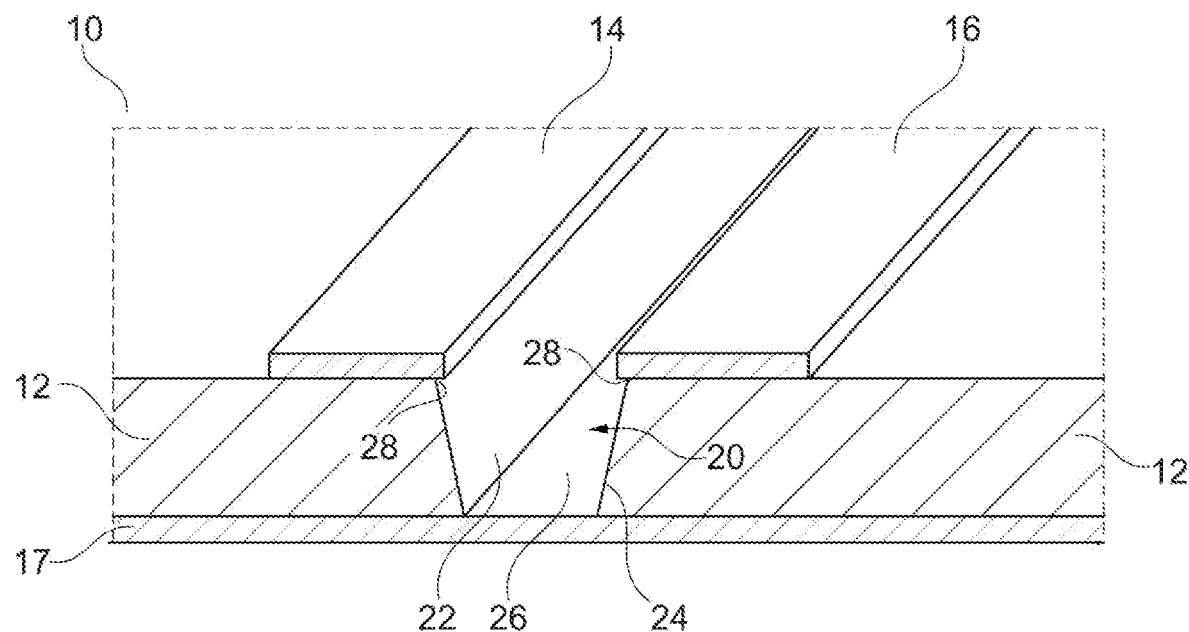
FIG. 3 shows a component carrier according to an exemplary embodiment of the present disclosure.

FIG. 3 shows a component carrier according to an exemplary embodiment of the present disclosure. More specifically, the component carrier comprises a stack 10 having at least one electrically conductive layer structure and/or at least one electrically insulating layer structure 12. The at least one electrically conductive layer structure comprises a first trace 14 and a second trace 16 arranged side-by-side on top of the electrically insulating layer structure 12. Below the electrically insulating layer structure 12, the stack further comprises a further electrically conductive layer structure 17 arranged on top of a substrate 18. Different from the conventional structure shown in FIG. 1 and discussed above, a tapering trench 20 is formed in the at least one electrically insulating layer structure 12 between and below the first trace 14 and the second trace 16. The trench 20 comprises sloped side walls 22 and 24, and thus tapers away from the first trace 14 and the second trace 16, i.e., the trench 20 gets narrower and narrower towards its bottom 26, which coincides with the further electrically conductive layer structure 17 below the electrically insulating layer structure 12. Furthermore, the trench 20 forms an undercut 28 under the first trace 14 and under the second trace 16, i.e., a part of the respective traces 14, 16 is not in direct contact with the electrically insulating layer structure 12 but hangs freely above the trench 20. The size of the undercut 28 is in a range from 2 µm to 40 µm, in particular from 5 µm to 10 µm. The undercut 28 further improves the performance and reduces losses since the absence of dielectric material under a part of the traces 14, 16 allows a strong field concentration. The trench 20 shown in FIG. 3 has a trapezoidal shape and may be filled with air, with a foam, or with a low permittivity (Dk) dielectric solid. The traces 14 and 16 may be single-ended lines or they may be differential lines. The trench 20 may have a depth in a range from 50 µm to 500 µm. The electrically insulating structure 12 may be free of fibers in order to facilitate forming the trench 20.

Figure 4:
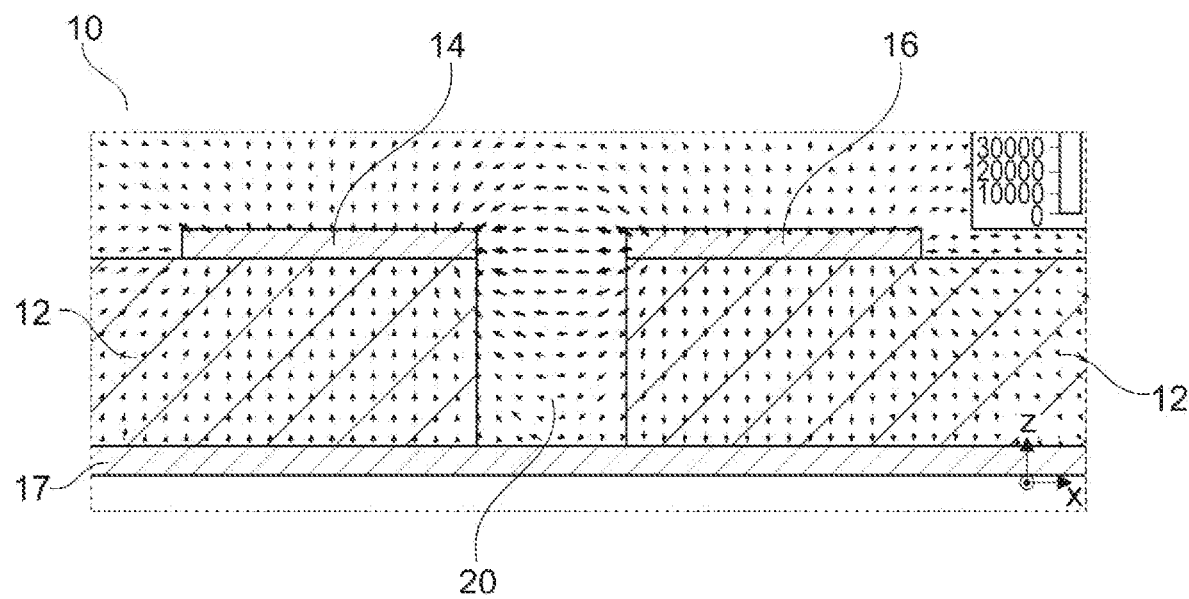
FIG. 4 shows an electric field distribution for the component carrier shown in FIG. 3.

FIG. 4 shows an electric field distribution for the component carrier shown in FIG. 3. As can be seen, the electric field distribution is similar to the case shown in FIG. 2 and discussed above, and since the trench 20 is located in a region with relatively high electric field strength, the resulting reduction in effective permittivity will have a correspondingly large impact. As a result, the capacitance between the two traces 14, 16 has been reduced (and so has the coupling). This lower differential pair capacitance enables faster switching speed, as the load for the driver is reduced. Furthermore, the lower effective Dk results in a faster signal propagation speed. More specifically, the velocity v of a signal is given by $$v = \frac{1}{\sqrt{\varepsilon\mu}}$$

where ε is the effective permittivity and µ is the effective permeability.

Figure 5:
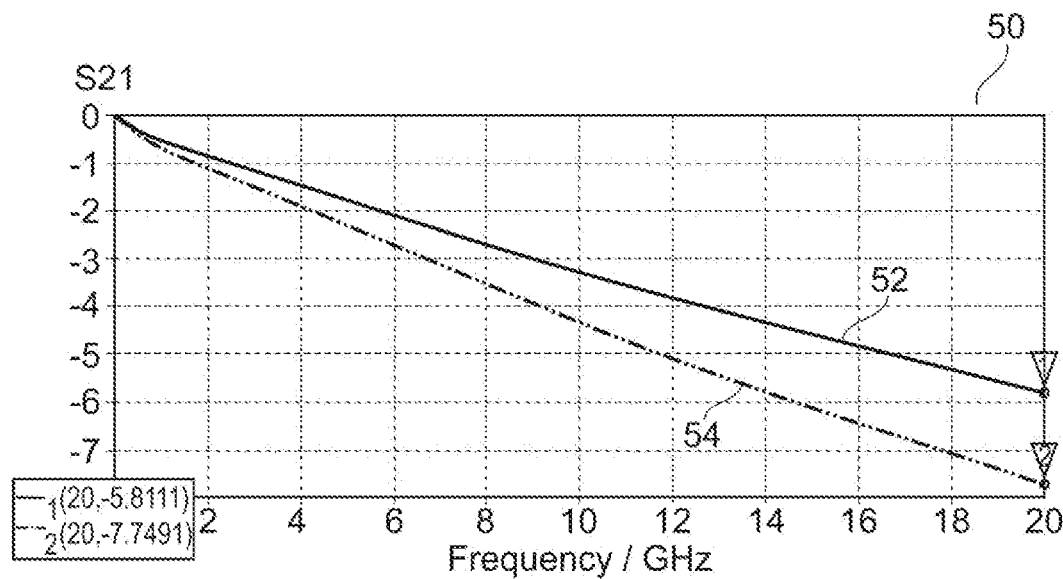
FIG. 5 shows a comparison of insertion loss for a component carrier according to an embodiment of the present disclosure and a conventional component carrier.
Figure 6:
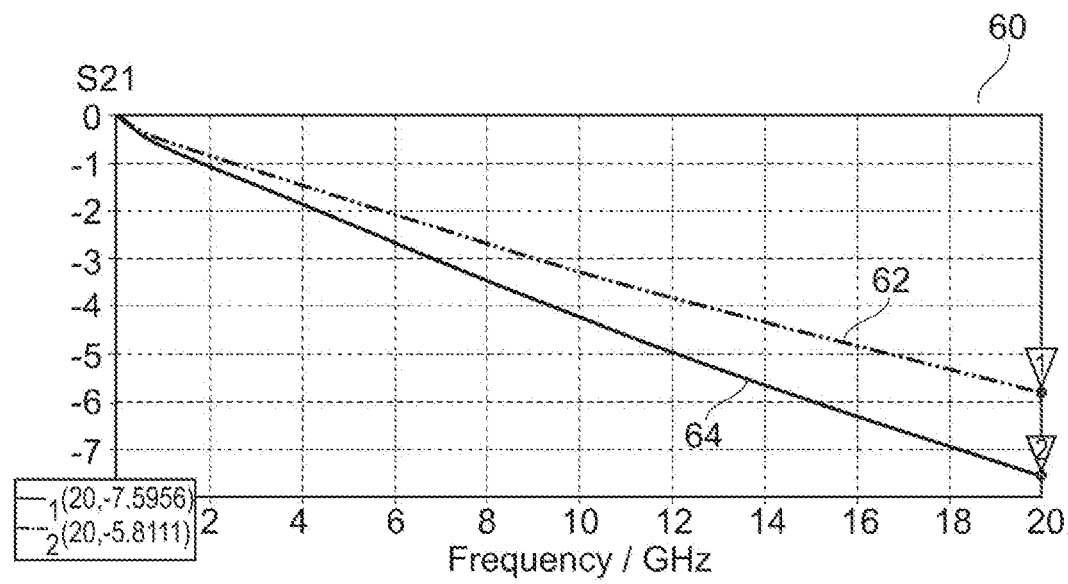
FIG. 6 shows a comparison of insertion loss for a component carrier according to another embodiment of the present disclosure and a conventional component carrier.

The beneficial effects are illustrated in more detail in FIG. 5 and FIG. 6. FIG. 5 shows a comparison of insertion loss (S21) for a component carrier according to an embodiment of the present disclosure and a conventional component carrier. More specifically, FIG. 5 shows calculated S21 parameter values in dB as a function of frequency between 0 and 20 GHz. The curve 52 shows the relationship between S21 and frequency for an embodiment of the present disclosure where the depth of the trench 20 is 125 µm and where the width of the traces 14 and 16 has been adjusted to provide a characteristic impedance equal to the characteristic impedance of the traces on the conventional component carrier. The curve 54 shows the relationship between S21 and frequency for traces on the conventional component carrier. As can be seen, the curve 52 is above the curve 54 at all frequencies which indicates an improvement in signal losses (of roughly 20%). At f=20 GHz, S21 is about −5.81 dB for the present disclosure and about −7.75 dB for the conventional structure, i.e., an improvement of around 1.9 dB. For the sake of completeness, it should be noted that the calculation resulting in the plot of FIG. 5 was made by simulating a structure where the traces 14 and 16 are 100 mm pure copper traces on a 0.125 mm standard FR-4 material with a constant Dk of 4.3 and Df of 0.025 for a frequency range from 0 to 20 GHz. In this case, the characteristic impedance was kept constant at 94Ω, which in return means that the trace width had to be lowered from 0.2 mm to 0.168 mm for the non-grooved (i.e., conventional) version. As the width reduction increases the losses as well, a second simulation was done where the trace width was kept constant. The result is shown in FIG. 6. For this configuration, the characteristic impedance is 84Ω for the non-grooved (conventional) pair and 94Ω for the grooved version. In both cases, a significant improvement in terms of signal losses can be observed (est. 20%). The second simulation was done in order to illustrate the negligible impact of the thinner traces. As can be seen from the values at 20 GHz in FIG. 6 (S21 is about −5.81 for the embodiment and about −7.60 for the conventional structure), the difference in comparison to FIG. 5 is only around 0.15 dB.

Figure 7:
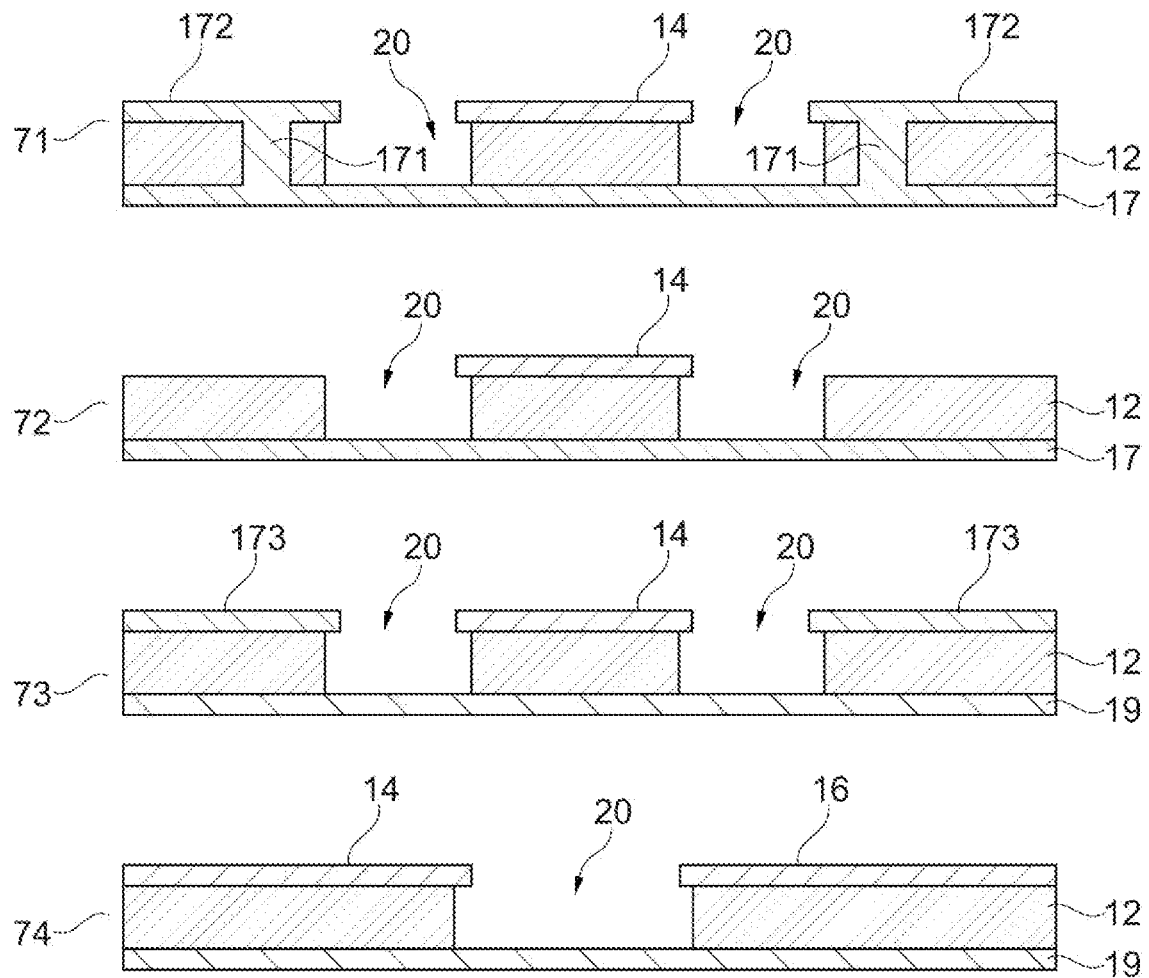
FIG. 7 shows various single-ended variations of component carriers according to further exemplary embodiments of the present disclosure.

FIG. 7 shows various single-ended variations of component carriers according to further exemplary embodiments of the present disclosure. More specifically, FIG. 7 shows a grounded coplanar waveguide 71, a micro stripline 72, a coplanar waveguide 73, and a slotline 74.

The grounded coplanar waveguide 71 comprises a single signal line 14 and cavities 20 formed in the electrically insulating layer structure 12 on both sides of the trace 14. Furthermore, a further conductive layer structure forms a ground (or reference) structure including layers 17 and 172 interconnected by vias 171.

The micro stripline 72 is structurally very similar to the coplanar waveguide 71 and differs therefrom only in that it does not include an upper reference layer 172 and vias 171.

The coplanar waveguide 73 comprises a single signal line 14 and cavities 20 formed in the electrically insulating layer structure 12 on both sides of the trace 14. Furthermore, a further conductive layer 173 at the same level (height) as the signal line 14 forms a ground (or reference) layer. Below the insulating layer 12, a further conductive layer 19 is formed.

The slotline 74 comprises two traces 14, 16 forming a single-ended signal line and separated by a single cavity 20. A further conductive layer 19 is formed below the insulating layer 12.

Figure 8:
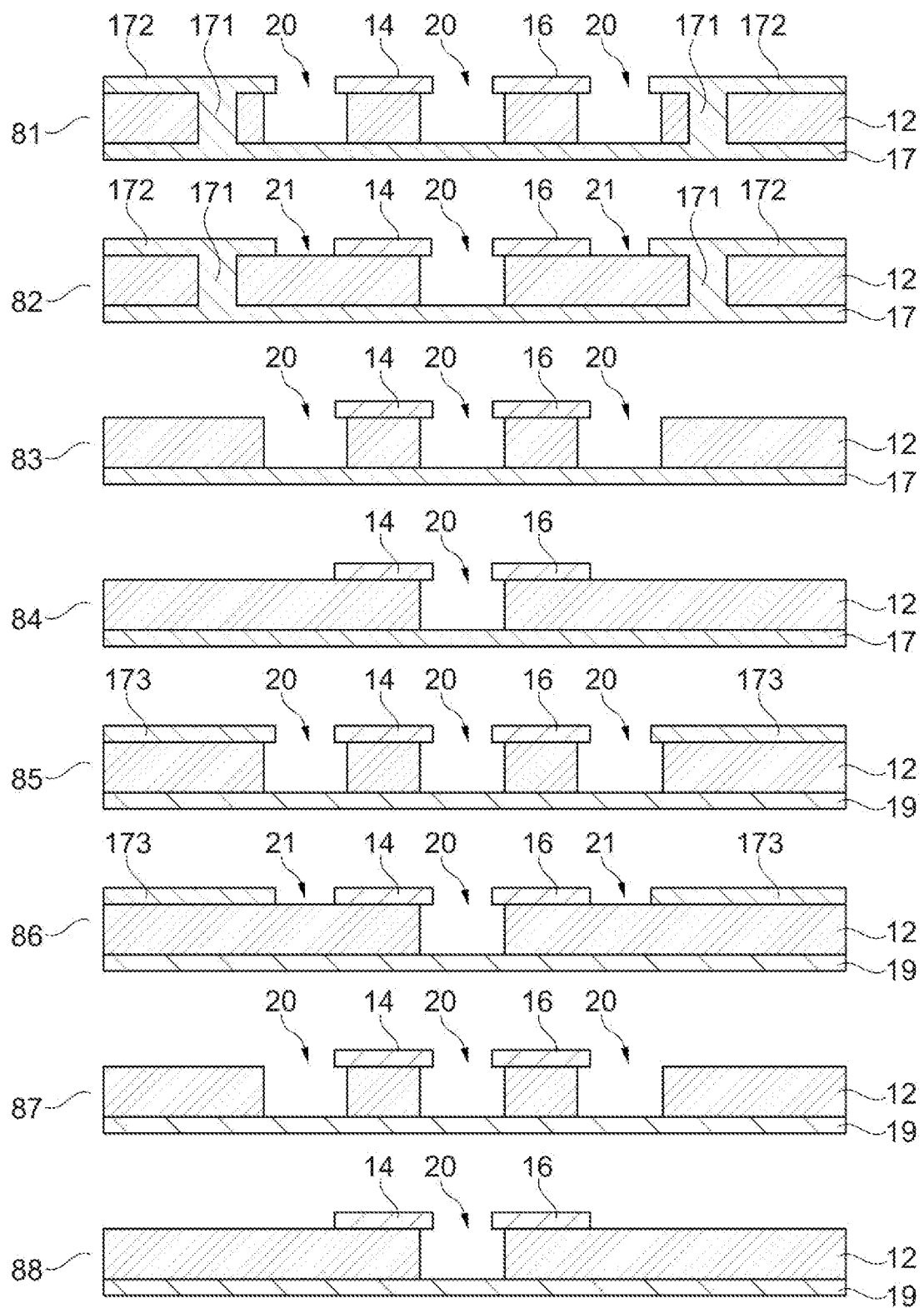
FIG. 8 shows various differential variations of component carriers according to further exemplary embodiments of the present disclosure.

FIG. 8 shows various differential variations of component carriers according to further exemplary embodiments of the present disclosure. More specifically, FIG. 8 shows a grounded coplanar waveguide 81 with multiple cavities 20, a grounded coplanar waveguide 82 with a single cavity 20, a differential microstrip pair 83 with multiple cavities 20, and a differential microstrip pair 84 with a single cavity 20. Each of the structures 81 and 82 comprises a reference (or ground) conductive structure formed by conductive layers 17 and 172 interconnected by vias 171, while each of the structures 83 and 84 comprises a single electrically conductive layer 17 acting as a reference (ground) layer below the insulating layer 12. In the structure 82, the upper reference layer 172 is separated from the traces 14 and 16 by corresponding gaps 21 on top of the insulating layer 12. FIG. 8 further shows a coplanar waveguide 85 with multiple cavities 20, a coplanar waveguide 86 with a single cavity 20, a differential pair 87 with multiple cavities 20, and a differential pair with a single cavity 20. These structures differ from the structures 81, 82, 83, and 84 in that they do not include a lower reference layer 17 but instead have a conductive layer 19 below the insulating layer 12. Otherwise, they correspond respectively to the structures 81, 82, 83, and 84.

It is explicitly noted that the cavities or trenches 20 are shown schematically in FIG. 7 and FIG. 8 and that these cavities 20 may in particular be shaped in the same way as the tapering trench 20 shown in FIG. 3 and discussed above. In other words, the cavities 20 may in particular have a trapezoidal cross-sectional shape.

Figure 9:
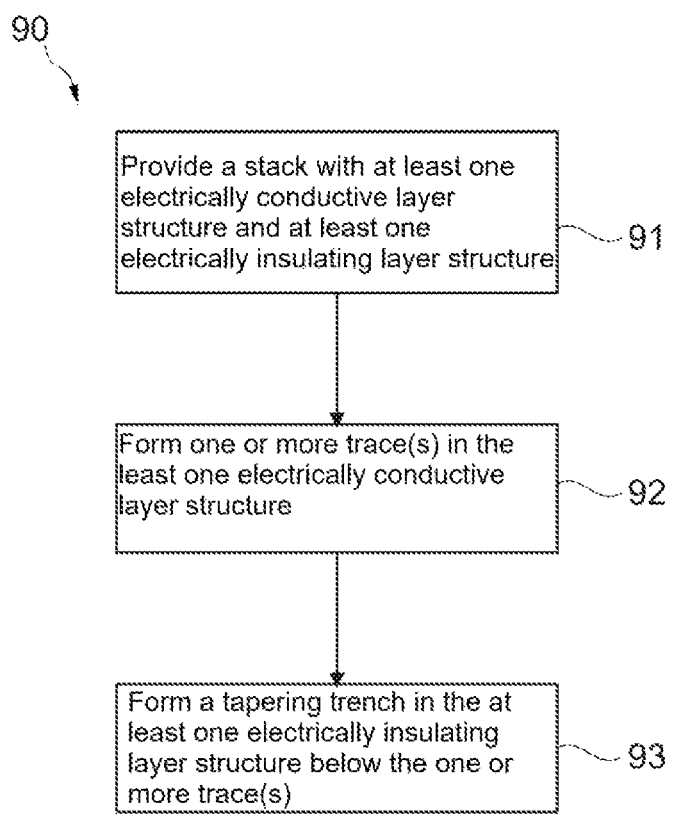
FIG. 9 shows a flowchart of a method of manufacturing a component carrier in accordance with an exemplary embodiment of the present disclosure.

FIG. 9 shows a flowchart 90 of a method of manufacturing a component carrier in accordance with an exemplary embodiment of the present disclosure. At step 91, the method comprises providing a stack 10 comprising at least one electrically conductive layer structure and/or at least one electrically insulating layer structure 12. At step 92, the method comprises forming the at least one electrically conductive layer structure with at least a first trace 14. If applicable, a second trace 16 is also formed and arranged side-by-side with the first trace 14. Finally, at step 93, the method comprises forming a tapering trench 20 in the at least one electrically insulating layer structure 12 beside and below the first trace 14, or if applicable, between and below the first trace 14 and the second trace 16. The trench 20 may be formed by laser processing, in particular by laser cutting. Alternatively, the trench 20 may be formed by etching, in particular by ion etching or plasma etching. Furthermore, or alternatively, the trench 20 may be formed by removing material of the at least one electrically insulating layer structure 12 using one of the at least one electrically conductive layer structure 17 as a stop layer.

It should be noted that the term "comprising" does not exclude other elements or steps and the use of articles "a" or "an" does not exclude a plurality. Also, elements described in association with different embodiments may be combined.

Implementation of the component carrier and method for manufacturing described herein is not limited to the preferred embodiments shown in the figures and described above. Instead, a multiplicity of variants is possible which variants use the solutions shown and the described principles even in the case of fundamentally different embodiments.

The invention claimed is:

1. A component carrier, comprising:
   a stack comprising at least one electrically conductive layer structure and/or at least one electrically insulating layer structure;
   wherein the at least one electrically conductive layer structure comprises a first trace; and
   wherein a tapering trench is formed in the at least one electrically insulating layer structure beside and below the first trace,
   wherein a bottom of the tapering trench is delimited by the at least one electrically conductive layer structure.

2. The component carrier according to claim 1, wherein the at least one electrically conductive layer structure further comprises a second trace, wherein the first trace and the second trace are arranged side-by-side, and wherein the tapering trench is formed in the at least one electrically insulating layer structure between and below the first trace and the second trace.

3. The component carrier according to claim 2, further comprising:

a high-frequency component surface mounted on and/or embedded in the stack;

a coupling antenna and at least one waveguide in the stack, wherein the first trace and/or the second trace connect the high-frequency component with the coupling antenna.

4. The component carrier according to claim 2, wherein the first trace and/or the second trace are arranged at a main surface of the stack.

5. The component carrier according to claim 1, wherein the trench tapers away from at least one of the first trace and the second trace.

6. The component carrier according to claim 1, wherein the trench forms an undercut under at least one of the first trace and the second trace.

7. The component carrier according to claim 6, wherein the undercut is in a range from 2 µm to 40 µm.

8. The component carrier according to claim 6, wherein the undercut is in a range from 5 µm to 10 µm.

9. The component carrier according to claim 1, wherein the tapering trench is trapezoidal.

10. The component carrier according to claim 1, wherein the tapering trench is air-filled or wherein the trench is filled with a foam or wherein the trench is filled with a low DK dielectric solid.

11. The component carrier according to claim 1, wherein the first trace and/or the second trace are single-ended lines.

12. The component carrier according to claim 1, wherein the first trace and the second trace are differential lines.

13. The component carrier according to claim 1, wherein a depth of the trench is in a range from 10 µm to 1000 µm.

14. The component carrier according to claim 1, wherein the electrically insulating layer structure in which the trench is formed is free of reinforcing structures.

15. The component carrier according to claim 1, wherein the electrically insulating layer structure in which the trench is formed is free of fibers.

16. A method of manufacturing a component carrier, the method comprising:

providing a stack comprising at least one electrically conductive layer structure and/or at least one electrically insulating layer structure;

forming the at least one electrically conductive layer structure with a first trace; and forming a tapering trench in the at least one electrically insulating layer structure beside and below the first trace by removing material of the at least one electrically insulating layer structure using one of the at least one electrically conductive layer structure as a stop layer.

17. The method according to claim 16, wherein the method comprises forming the trench by laser processing or by etching.

18. The method according to claim 16, wherein the method comprises forming the trench by laser cutting, ion etching, or plasma etching.

* * * * *